United States Patent [19]

Dyer et al.

[11] 4,352,009
[45] Sep. 28, 1982

[54] VARIABLE RATIO TOTALIZER

[75] Inventors: Robert E. Dyer; Murray C. Carney, both of Dunwoody, Ga.

[73] Assignee: Sangamo Weston, Inc., Atlanta, Ga.

[21] Appl. No.: 1,872

[22] Filed: Jan. 8, 1979

[51] Int. Cl.³ .......................... G06M 3/08; G11B 5/00
[52] U.S. Cl. ........................... 235/92 ST; 235/92 SH; 235/92 MT; 360/6
[58] Field of Search ..... 360/6; 364/483, 900 MS File; 235/92 MT, 92 EL, 92 ST, 92 SH, 92 EA

[56] References Cited

U.S. PATENT DOCUMENTS

| | | | |
|---|---|---|---|
| 3,366,924 | 1/1968 | Brown ..................................... | 360/6 |
| 3,803,497 | 4/1974 | Tyau ................................ | 235/92 ST |
| 3,941,982 | 3/1976 | Knollenberg et al. .......... | 235/92 SH |
| 4,122,498 | 10/1978 | Dyer ........................................ | 360/6 |
| 4,166,975 | 9/1979 | Germer et al. ...................... | 364/483 |
| 4,179,654 | 12/1979 | Germer .............................. | 364/483 |
| 4,197,451 | 4/1980 | Dyer et al. .................... | 235/92 MT |
| 4,227,070 | 10/1980 | Baker et al. .................. | 235/92 MT |

Primary Examiner—Joseph M. Thesz
Attorney, Agent, or Firm—Emrich, Lee, Brown & Hill

[57] ABSTRACT

A totalizer receives output pulses from two different meters and records them on a single data channel of a magnetic recorder. First and second memories are used alternately in successive demand intervals to store the outputs from both meters irrespective of which meter measured an event. For recording, contents of the respective memories are shifted out in alternate demand intervals. Demand interval timing signals are delayed and recorded in synchronism with the data so that the accuracy of recording is ± one event pulse per demand interval. Each memory acts as a summing register for both meters. Thus, the proportion of available storage allocated to each meter is varied according to the respective activity levels of the meters up to the maximum capacity of the recorder.

7 Claims, 4 Drawing Figures

VARIABLE RATIO TOTALIZER

BACKGROUND AND SUMMARY

The present invention relates to apparatus for measuring and magnetically recording events from two independent sources. In the electric power industry, such a device is sometimes referred to as a "totalizer" in that it sums or totals measured events from more than one source or meter. Such a measured event may be, for example, the consumption of units of real power (Kw) or reactive power (KVAR).

Electric power companies use magnetic recorders for billing and survey applications. Typically, an electric power meter of the conventional rotating disc type is equipped with a pulse initiator which generates an electrical pulse for each "event" which is detected or measured. Each pulse thus represents the measurement of a predetermined quantity of real or reactive power that has been consumed (or transmitted, in the case of two power company's sharing an intertie).

The pulses representative of the measured events are recorded on a magnetic recorder having a slow moving tape (for example, the tape may move at 1.75 in. every fifteen minutes). Along with the event or data pulses, a time mark is also recorded by the recorder. Such time marks typically record a fifteen minute interval, which may be a demand interval. These intervals may be used to apply different rates for power consumption.

When a meter of this type is read, the magnetic tape is removed from the recorder, and a new tape replaces it. The recorded tape is then taken to a remote location where it is read by a device referred to as a translator.

One common instance in which totalizers are used is when power companies have their power feed lines interconnected (called an "intertie") so that if a demand is made on one utility that is above its present operating capacity, power may be drawn from the second utility. Energy flowing between the utilities must be measured so that a record can be kept indicating what quantities of power were used by each utility, and the time periods during which such power was consumed. The electric meters used in such instances may be equipped with pulse initiators, as described above. For example, a pulse initiator may generate an electrical pulse for each revolution of a rotating disc on a conventional power meter.

For billing purposes, it is desirable to record these pulses on a magnetic recorder with associated time interval pulses, and there are a number of such magnetic recorders available for billing or for survey applications. The two kinds most commonly used in the industry are two-track and four-track magnetic recorders. One recording track is usually set aside for recording time pulses or marks which define the demand intervals which are typically fifteen minutes. Of the remaining three tracks on a four-track magnetic recorder two may be used for measuring real power, one for each power company, and the remaining track may be used for measuring reactive power for both companies.

One system for recording outputs from two separate meters on a single data track on a magnetic recorder is described in co-pending, co-owned application of Dyer and Hyde for TOTALIZER APPARATUS FOR RECORDING TWO DATA INPUTS ON A SINGLE CHANNEL, which was issued as U.S. Pat. No. 4,197,451 on Apr. 8, 1980. In this system, the totalizer generates a train of recording pulses at a predetermined "offset" repetition rate, preferably in the mid range of the channel capacity of the recorder. For example, if the data track of the recorder has a capacity of 6,000 pulses per hour, the offset repetition rate is chosen to be 3,000 pulses per hour. If neither input meter is recording power, the totalizer will record pulses on the common data track at a rate of 3,000 pulses per hour. The totalizer increases the repetition rate of the recording pulses above the offset rate in response to the increase in repetition rate of signals received from one of the sources; and it decreases the repetition rate of the recording pulses below the offset rate in response to an increase in the repetition rate of the signals received from the other source. Thus, this totalizer provides a bidirectional capacity in that it enables the recorder to record events from two sources on a single data track. However, a predetermined portion of channel capacity, (namely, 3,000 pulses per hour) is allocated to each meter. If one of the meters records at a rate greater than 3,000 pulses per hour, all pulses over that rate will be lost, even though the recording capacity of the recorder is 6,000 pulses per hour.

The present invention is thus directed to a totalizer which is capable of recording the output signals of two separate meters on a single data channel, and in which the full recording capacity of the data channel may be used for either meter output if such capacity is available—that is, to the extent the other meter is not measuring events. To accomplish this, first and second first-in, first-out (FIFO) memories are used alternately in successive demand intervals to sum the outputs from both meters. In other words, during a first demand interval, the first FIFO memory records output signals representative of measured events from both meters, and during the next successive demand interval, the second FIFO memory records signals representative of events occurring in the next successive demand interval.

For recording, the contents of the two FIFO memories are shifted out in alternate demand intervals. The demand interval signals which are recorded on the time track of the recorder are delayed so as to be recorded in synchronism with the data pulses associated with that demand interval. Thus, the accuracy of recording is within one event or data pulse per demand interval. Each FIFO memory acts as a summing register for both meters. Thus, the proportion of available storage allocated to each meter depends upon the respective activity levels of the meters up to the maximum capacity of the recorder. If, for example, one of the meters is recording at a rate of 1500 data pulses per hour for a given demand interval, and the other meter records at a rate of 4,000 data pulses per hour for the same interval, the system will record at a rate of 5500 data pulses for the two meters for that particular demand interval, and the data within that interval will be accurate to within one pulse. This is the accepted accuracy of precision recorders.

Once a demand interval is terminated, the output pulses from the meters are recorded in the other FIFO memory, while recording on the data track from the first FIFO memory continues until that data is exhausted. Thereafter, when the time mark is recorded on the time recording track, the contents of the second FIFO memory are shifted to the output for recording on the data track.

Since the time mark pulse is delayed approximately only two seconds so that the exact number of data pulses are recorded in a given demand interval, the FIFO memories are not required to have, and in fact do not have, a large capacity. Rather, sixteen bit memories are sufficient for the desired operation.

Other features and advantages of the present invention will be apparent to persons skilled in the art from the following detailed description of a preferred embodiment accompanied by the attached drawing.

THE DRAWING

DETAILED DESCRIPTION

Figure 1:
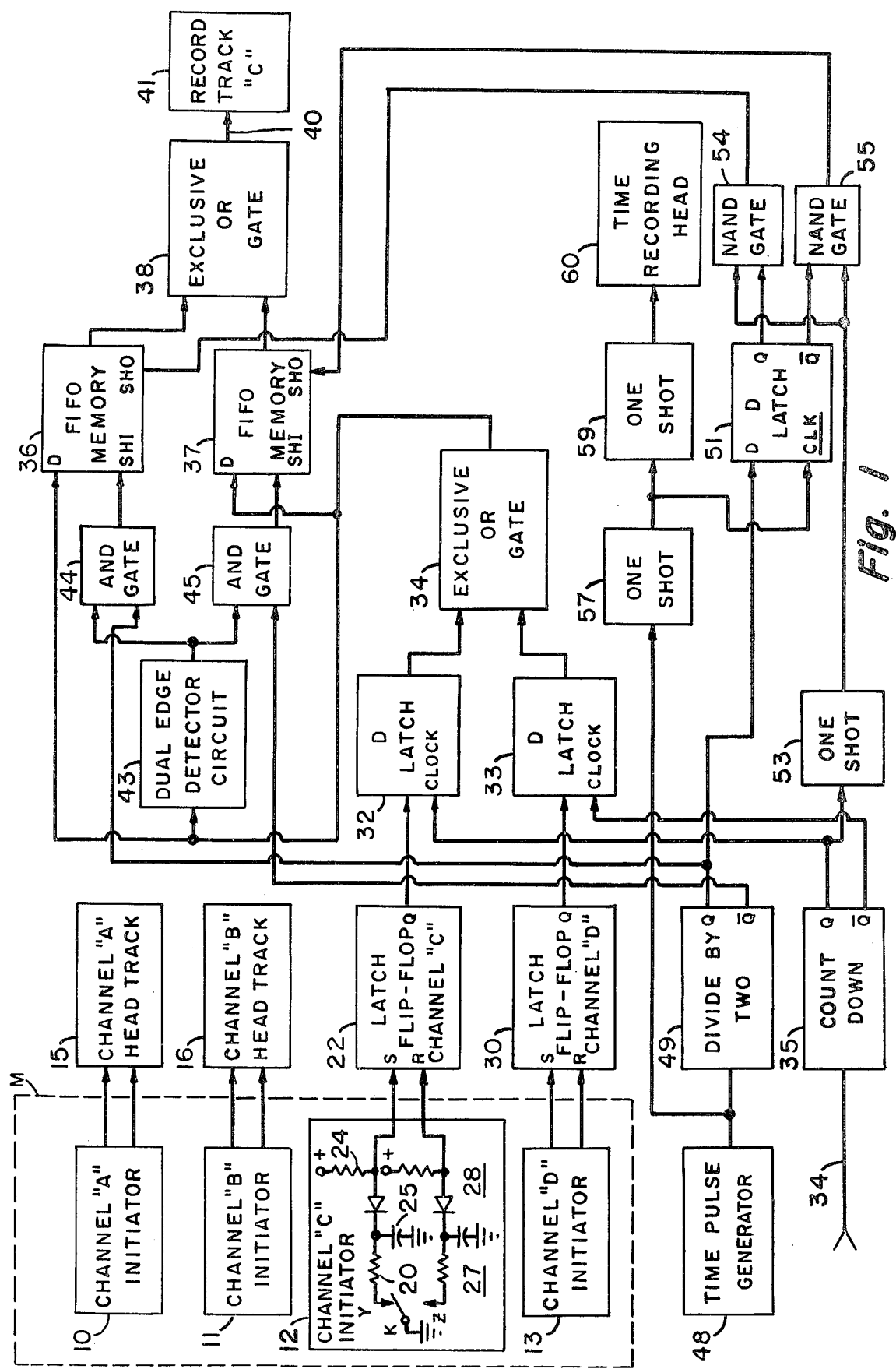
FIG. 1 is a functional block diagram of a system constructed according to the present invention.

Referring to FIG. 1, the pulse output circuits of four separate meters are enclosed within dashed block M. These output circuits include a Channel A Initiator 10, a Channel B Initiator 11, a Channel C Initiator 12, and a Channel D Initiator 13. These pulse initiators may be of the type sold under the designation SPI Pulse Initiator by Sangamo Weston, Inc. of West Union, S.C.

For purposes of explaining the invention, the pulse initiators 10 and 11 are associated with kilowatt-hour meters; and their outputs are coupled directly to a channel A head track 15 and a channel B head track 16 for direct recording of data representative of quantities of electrical power consumed by two users, which may be power stations.

The pulse initiators 12, 13, in this example, are associated with meters which measure reactive voltamperes. Other electrical quantities or "events", or different combinations of events may be measured by the meters M.

Each of the pulse initiators described above may use light emitting diodes, phototransistors and power transistors; however, schematically, each initiator can be diagrammatically represented as a single-pole, double-throw switch, including terminals K, Y and Z, as illustrated for the pulse initiator 12. The K terminal which represents a movable arm is grounded. The Y and Z terminals represent respectively the output terminals of the pulse initiator.

As indicated above, the function of the pulse initiators is to detect or sense events, such as the consumption of real or reactive power. Typically, this is done by detecting the rotation of a disc on a conventional meter mechanism which has been equipped with a pulse initiator. Each time an "event" is sensed, the wiper arm moves from one of the contacts Y or Z to the other to generate a voltage level change which is referred to as a "pulse".

Pulse initiator 10 may be associated with a real power meter which measures real power consumed by station B. Pulse initiator 11 is associated with a real power meter which measures real power consumed by station A. Pulse initiator 12 is associated with a reactive power meter which measures reactive volt-amperes transmitted from station A to station B; and pulse initiator 13 is associated with a reactive power meter which measures reactive volt-amperes transmitted from station B to station A.

The outputs of pulse initiators may be stored on separate tracks of a magnetic cartridge recorder, such as the four-track magnetic recorder model MCR-4, also sold by Sangamo Weston, Inc. Time marks or pulses are recorded on the third track. Data pulses representative of the combined or totalized outputs of the channel C and channel D pulse initiators 12, 13 are recorded on the fourth track in a manner to be presently described and in accordance with the present invention.

As indicated above, all of the pulse initiators 10–13 are similar in structure and have similar circuitry associated with them for coupling into their respective output circuits, so only one need be shown in detail for a complete understanding. Turning then to the initiator 12, the Y terminal of the pulse initiator is connected through a resistor 20 and a diode 21 to the set input S of a latch flip-flop 22. The set input of the latch 22 is connected through a bias resistor 24 to a positive supply voltage. The junction between the resistor 20 and diode 21 is connected to a capacitor 25, the other side of which is connected to ground. The resistor 20 and capacitor 25 provide a filter; and the diode 21 acts to de-couple any positive voltages from the input to the flip-flop.

The reset input R of the latch 22 is connected through a similar filter generally designated 27 and de-coupling network 28 to the Z terminal of the pulse initiator 10. The latch 22 and its associated input network compensate for any "bounce" or noise from the contacts of the pulse initiator which feeds it. The latch is a conventional flip-flop circuit comprising cross-coupled NAND gates. Thus, when the S input is low (logic "0"), the Q output is high (logic "1").

Each time the pulse initiator switches from one state to the other, the latch 22 changes state; and these state changes are sometimes referred to as "pulses" because they produce corresponding flux changes on the recording medium which, when read back do in fact produce pulses. Thus, the latch 22 generates an output signal each time the initiator changes state, thereby generating a signal representative of an "event".

The outputs of the channel D initiator 13 are similarly connected to the set and reset inputs of a latch flip-flop 30. The outputs of the latches 22, 30 are fed respectively to the data inputs of D type latch circuits 32, 33.

A 60 Hz signal is received on a line 34 and fed to a countdown circuit 35 which may be a conventional binary counter. The countdown circuit 35 generates an output square wave having a repetition rate of 6,000 cycles per hour. This signal is fed to the clock input of the D latch 32; and the inverted clock signal is fed from the $\overline{Q}$ output of the countdown circuit 35 to the clock input of the D latch 33. Thus, the latches 32, 33 are clocked 180° out of phase.

The outputs of the D latches 32, 33 are fed to the inputs of an EXCLUSIVE OR gate 34, the output of which is coupled to the data inputs of two separate First-In, First-Out memories 36, 37 (referred to in short as FIFO memories).

Briefly, each of these memories is a sixteen-bit memory having a data input D, a "shift in" input SHI, a "shift out" input designated SHO, and an output. The outputs of the memories are fed to an EXCLUSIVE OR gate 38, the output of which is coupled along a line 40 to the channel C head track diagrammatically illustrated at 41.

The memories 36, 37 are each sixteen-bit registers, and they may be part No. CD40105B, manufactured by RCA Corporation, of Sommerville, N.J.

The output signal of the EXCLUSIVE OR gate 34 is also fed to a Dual Edge Detector Circuit 43, the output of which is connected to one input of each of two AND gates 44, 45. The outputs of the AND gates 44, 45 are connected respectively to the "shift in" terminals of the memories 36, 37.

Figure 2:
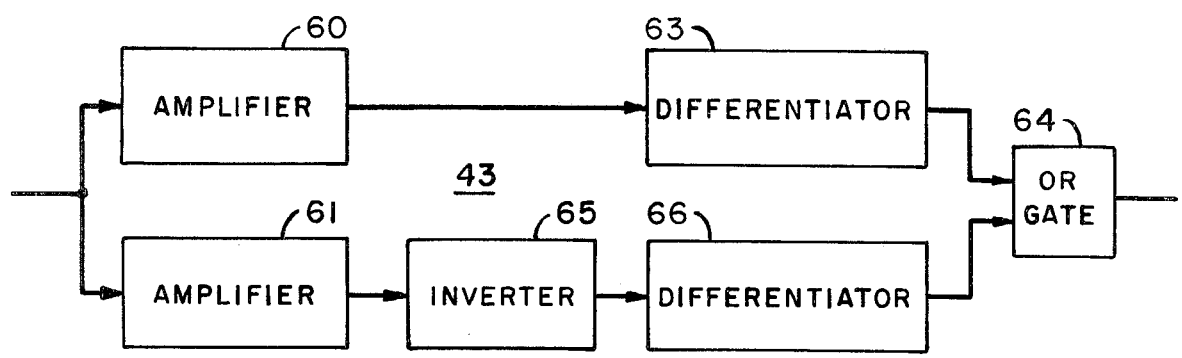
FIG. 2 is a logic schematic diagram of the Dual Edge Detector circuit of FIG. 1.

Referring to FIG. 2, the Dual Edge Detector Circuit 43 is shown in more detail as comprising first and second amplifiers 60, 61 having their inputs connected together to receive the output signal of the EXCLUSIVE OR gate 34. The output of amplifier 60 is differentiated in differentiator circuit 63, the output of which feeds an OR gate 64. The output of amplifier 61 is inverted in inverter circuit 65 and differentiated in differentiator circuit 66, the output of which also feeds the OR gate 64. The output of the OR gate 64 is thus a train of pulses, all having the same polarity, and each pulse occurring substantially simultaneously with a change of state of the output signal from the EXCLUSIVE OR gate 34, allowing, of course, for delay through the circuit just described. The series circuit of amplifier 60 and differentiator 63 provides a pulse for each positive going edge, and the series circuit of amplifier 61, inverter 65 and differentiator 66 provides a similar pulse for each negative going edge.

Each of the FIFO memories acts, briefly, as follows. A binary signal level is presented to the Data Input, and when a shift signal is presented to the "shift in" terminal, that data signal is stored in one memory location. Subsequent data bits may be stored in a similar fashion but in different memory locations. The output may operate asynchronously relative to the input, so that the earliest stored data bit is presented to the output when a signal is presented to the "shift out" terminal. In this manner, the earliest data bit is coupled to the output, and this operation does not have to occur synchronously with the storing of data.

Turning now to the lower left hand portion of FIG. 1, a Time Pulse Generator 48 generates a time mark at the beginning (or end) of each demand interval. The Time Pulse Generator 48 may be a cam-actuated switch driven by the synchronous motor of the MCR-4 recorder. Typically, it generates a timing pulse or time mark every fifteen minutes of operation. The output of the Time Pulse Generator 48 is coupled to a "Divide by Two" Circuit 49 (which may be a simple one-stage counter). The Q output of the Divide by Two Circuit 49 is connected directly to the second input of the AND gate 44, and it is also connected to the data input D of a D-type latch circuit 51. The $\overline{Q}$ output of the Divide by Two Circuit 49 is connected to the second input of the AND gate 45 which feeds the FIFO memory 37. The output from the Divide by Two circuit 49 is used to alternately activate or determine which FIFO memory is in current use for a complete demand interval. When the Q output is high, the AND gate 44 is enabled, and the shift pulses from Dual Edge Detector Circuit 43 are coupled to the Shift-In input of the FIFO memory 36, thereby enabling whatever data is present on the D input to be stored in it. Conversely, when the $\overline{Q}$ output of the Divide by Two circuit 49 is high, the AND gate 45 is enabled, thereby enabling the output of the Dual Edge Detector Circuit 43 to be coupled to the Shift-In of the FIFo memory 37. As previously indicated, the data signals to each of the FIFO memories are identical, being received from the output of the EXCLUSIVE OR gate 34.

The countdown circuit 35 receives the 60 Hz line signal and counts the frequency down to establish a clock rate of 6000 cy/hr (that is, a period of 0.6 seconds). The Q and $\overline{Q}$ signals from the countdown circuit 35 are shown on lines L1 and L2 of FIG. 3 respectively. The Q output of the countdown circuit 35 is also fed to a monostable circuit 53, the output of which is connected to one input of each of two NAND gates 54, 55. These gates are used to steer Shift-Out pulses from monostable circuit 53 to one or the other of the FIFO memories 36, 37, depending on which one is storing data. Hence, the outputs of the gates 54, 55 are connected respectively to the Shift-Out terminals of the memories. The other inputs of each of the NAND gates 54, 55 are received respectively from the Q and $\overline{Q}$ outputs of the latch 51. The latch 51 is clocked by the output of a one-shot (i.e. monostable) circuit 57 which serves to delay the output demand interval signal from the Time Pulse Generator 48. This same demand signal is fed to a second one shot circuit 59 which has its output coupled to a time recording head 60 for recording the demand interval signal on the magnetic recorder.

OPERATION

Figure 3:
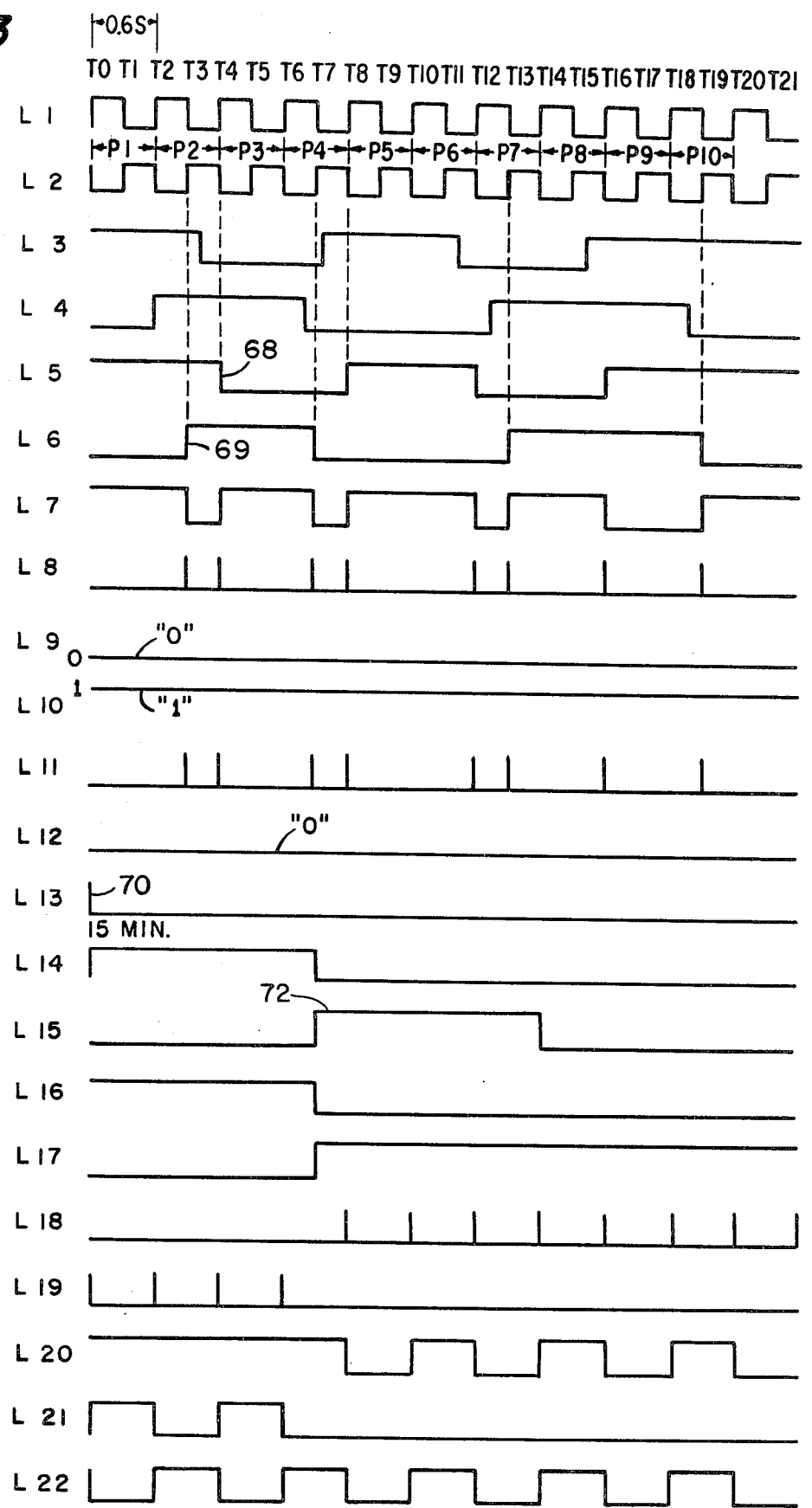
FIG. 3 is a timing diagram illustrating the various voltage waveforms of the apparatus of FIG. 1 during a first demand interval.
Figure 4:
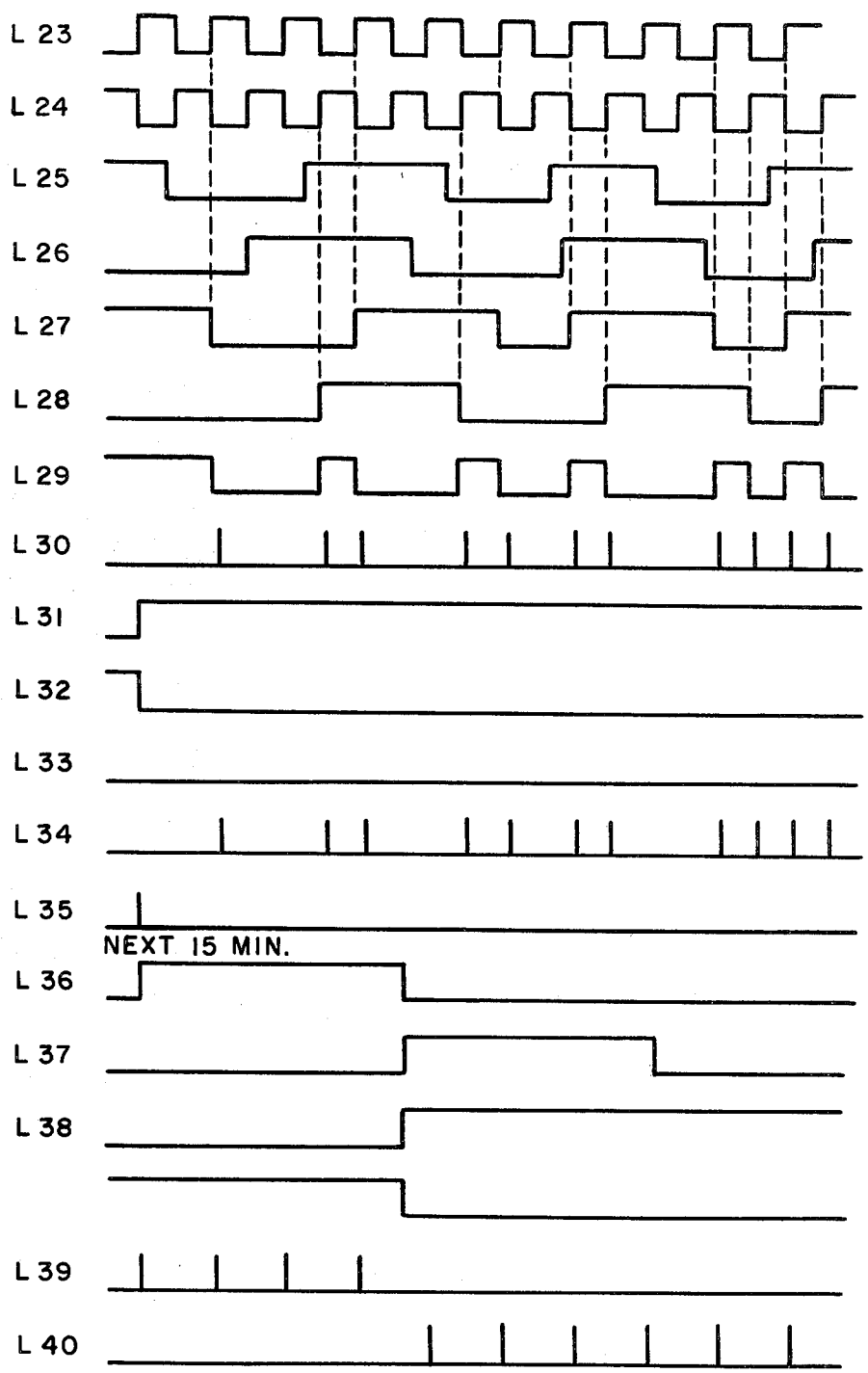
FIG. 4 is a timing diagram similar to FIG. 3 showing the same voltages during the next succeeding interval.

Before discussing the detailed voltage/time waveforms of FIGS. 3 and 4 under the various input conditions, it will be helpful, it is believed, to have an overall understanding of the operation of the circuitry of FIG. 1. During a first demand interval, as determined by the occurrence of a pulse from the Time Pulse Generator 48, let it be assumed that the Q output of the Divide by Two Circuit 49 is high. This signal enables the AND gate 44 for a complete demand interval. At the same time, the $\overline{Q}$ output of the Divide by Two Circuit 49 disables AND gate 45. Each of the latches 32, 33 generates an output state change (not a complete pulse) for each event detected by its associated pulse initiator 12, 13. These latch circuits 32, 33 are clocked at 6000 pulses per hour, as determined by the countdown circuit 35; and as indicated, the latch 32 is clocked at the beginning of a clock cycle, and the latch 33 is clocked at the mid point of a clock cycle. If either initiator detects an event during a clock cycle, the output of its associated latch flip-flop 22 or 30 will generate a level change; and that level change will be synchronized with the clock by the associated D latch 32 or 33, thereby changing the input state of one of the input leads of the EXCLUSIVE OR gate 34. This, in turn, will result in a state change in the output of the EXCLUSIVE OR gate 34; and the leading edge, as detected by the Dual Edge Detector Circuit 43 will be coupled through the enabled AND gate 44 to shift the corresponding data bit from the EXCLUSIVE OR gate 34 into the FIFO memory 36. In this manner, latches 32 and 33 and the EXCLUSIVE OR gate 34 act as a first combining circuit for the meter outputs so that the events detected during a given demand interval will be fed into the FIFO memory 36. These data signals are shifted out of the FIFO memory 36 by means of the same clock signal derived from the Divide by Two Circuit 49 and coupled to the D input of the latch 51, but delayed by the amount of delay of the one shot circuit 57. The reason for the delay is to account for the time difference between shifting into and shifting out of memory and the delay encountered in the out-of-phase clocking of D latch 33. A delay of 2.2 seconds (3 and ½ clock cycles) insures that all data stored in a memory will be shifted out before the time interval pulse is recorded.

Thus, all of the data bits representative of measured events are shifted out of the FIFO memory 36 to the EXCLUSIVE OR gate 38 which acts as a second combining circuit (for the memories). Since the other input to the EXCLUSIVE OR gate 38 remains unchanged during this demand interval, the output signal on line 40 thus is a signal having a level change for each event detected by either initiator 12 or 13 during a given demand interval, and this signal is recorded on the C track of the magnetic cartridge recorder.

Since the output signals from the two initiators 12, 13 are clocked 180° out of phase (the Q and $\overline{Q}$ outputs of the countdown circuit 35), no data signals are lost provided the data rate is within the capacity of the system. Since the time mark pulse is delayed so as to coincide with the recording of the associated data pulses, an accuracy is achieved within one pulse of the actual measured events. The trailing edge of the output of the one shot 57 triggers the one shot 59. The output of the one shot 59 is recorded as the time mark signal defining demand intervals. Even though the time mark pulse is delayed on the recording, it nevertheless defines the data pulses that have occurred during a specific demand interval, and since it is delayed approximately only two seconds, this slight difference does not affect the readout from the translator when the tape is played back.

Turning now to FIG. 3, on line L1, there is shown the Q output of the countdown circuit 35; and on line L2, there is shown the $\overline{Q}$ output which is the complement of the Q output. The various times of the clock signal are designated T0, T1, etc.; and each complete cycle or period is designated P1, P2, etc.

Lines L3 and L4 represent the output signals of the channel C and channel D latch flip-flops 22, 30 respectively. It will be recalled that the output of each of these latch flip-flops changes state each time its associated pulse initiator changes state.

The output signals of the latch flip-flops 22, 30 are fed to the inputs of the D-type latch flip-flops 32, 33 respectively. The D latch 32 is clocked by the signal on line L1, and the D latch 33 is clocked by the signal on line L2 of FIG. 3. The output signal of latch 32 is shown on line L5 of FIG. 3. For example, at time T4, the output of latch flip-flop 22 on line L3 is low, so the clock pulse causes the output of the D latch 32 to go low at time T4, as illustrated by the negative-going edge 68 on line L5. Similarly, at time T3, the output of latch 30 is positive, so the output of the D latch 33 goes positive when the complementary clock goes positive at time T3, as indicated by the positive-going edge 69 on line L6. It will thus be observed that the output signals of the two meter channels are clocked 180° out of phase. This permits the sytem to respond to measured events even though two such events occur within the same clock period, as indicated, for example, during the period P4. Further, it will be observed that the outputs of the D latches 32, 33 are synchronous with the system clock. Hence, the output signal of the EXCLUSIVE OR gate 34, as indicated on line L7 is also synchronous with the system clock. The output of the EXCLUSIVE OR gate 34 changes state, in summary, for each event detected by either pulse initiator 12 or 13. The EXCLUSIVE OR gate 34 thus acts as a circuit for combining the parallel outputs of the two meter sources 12, 13.

The output signal from the EXCLUSIVE OR gate 34 is fed to the Dual Edge Detector Circuit 43 which produces the train of pulses shown on line L8, each pulse coinciding with a change in state in the signal from the EXCLUSIVE OR gate 34.

The time mark signal defining the beginning (or end) of a demand interval from the time pulse initiator 48 is shown at 70 on line L13. Assuming that the Q output of the Divide by Two Circuit 49 is a logic 0 as seen on line L9 (the $\overline{Q}$ output being seen on line L10), the AND gate 44 is enabled, and the AND gate 45 is disabled. Thus, the output signal shown on line L8 from the Dual Edge Detector Circuit 43 is coupled through the AND gate 44 (see line L11) to shift the output from the EXCLUSIVE OR gate 34 into the FIFO memory 36. Since the AND gate 45 is disabled, its output, as seen on line L12 is a constant "0" level signal.

The time mark pulse from the time pulse generator 48, as indicated, is delayed by means of the one shot circuit 57 for clocking the output of the Divide by Two Circuit 49 into the D latch 51. The output of the one shot circuit 57 is shown on line L14 of FIG. 3. The delayed timing pulse 72 is generated by the one shot 59 which is triggered by the negative edge of the output of one shot 57, as shown on line L15. The corresponding output state changes of the Q and $\overline{Q}$ outputs of flip-flop 51 are shown on lines L17 and L16 respectively. When the Q output of latch 51 goes to a logic 1 level, the NAND gate 54 is enabled, and when clock pulses from the countdown circuit 35 trigger the one shot 53, its normally high output goes negative for a short period of time. These pulses are then gated through NAND gate 54 and appear as positive pulses to shift out the contents of the FIFO memory 36. The output of the NAND gate 54 is shown on line L18.

Prior to the negative edge of the output pulse from the one shot circuit 57, the NAND gate 55 had been enabled, and clock pulses were gated through it, as indicated on line L19.

Once, however, the NAND gate 54 is enabled, as described above, the contents of the FIFO memory 36 are coupled, as indicated on line L20, to the EXCLUSIVE OR gate 38. Line L21 illustrates that prior to the occurrence of the delayed time mark, contents of the FIFO memory 37 were output to the EXCLUSIVE OR gate 38, which acts as a combining circuit for combining the outputs of both FIFO memories in successive time intervals, its output being shown in line L22 of FIG. 3.

Turning now to FIG. 4, there is shown a second timing diagram in which the second FIFO memory 37 is active, and the FIFO memory 36 is inactive, by virtue of the Divide by 2 Circuit 49 having changed its state. This circuit thus serves as a memory select circuit. The voltge waveforms shown on lines L23–L40 correspond to those shown on lines L1–19 of FIG. 3 (lines L38 in FIG. 4 corresponding to lines L16 and L17 of FIG. 3); in the sense that they are associated with the respective circuits for the waveforms already described. However, in this case, the FIFO memory 37 is active, and this is indicated because the waveform on line L32 enables the AND gate 45, whereas the voltage on line L31 disables the AND gate 44. Similarly, it will be observed that the input to the FIFO memory 36 as shown on line L33 (corresponding to line L11 of FIG. 3) remains steady, whereas data is being presented to the FIFO memory 37, as indicated on line L34. With the occurrence of the delayed time mark pulse as indicated on line L37, the Shift Out pulses (line L41) are coupled from the NAND gate 55.

Comparing FIGS. 3 and 4, and referring particularly to the last four data pulses on line L34 of FIG. 4, if these were the last four pulses to have occurred during a demand interval, then the corresponding data would have been gated out of the FIFO memory 37 and into the EXCLUSIVE OR gate 38 as indicated by the four level changes shown on line L21 which, it will be recalled, is the shifted output of the FIFO memory 37 prior to change in the memory select circuitry.

Having thus disclosed in detail a preferred embodiment of the invention, persons skilled in the art will be able to modify certain of the structure which has been disclosed, and to substitute equivalent elements for those described while continuing to practice the principle of the invention; and it is, therefore, intended that all such modifications and substitutions be covered as they are embraced within the spirit and scope of the appended claims.

We claim:

1. In apparatus for recording data signals from first and second sources on a single channel, each source generating a signal representative of a measured event, said apparatus further including a source of periodic timing signals for defining successive time intervals, the combination comprising: input circuit means for receiving the output signals of said first and second sources and delaying the signals of one source relative to the other, first combining circuit means responsive to said input circuit means for generating a train of data signals representative of the combined signals from said sources; first and second memory circuit means, each having a data input connected to an output of said first combining circuit means for receiving data signals and being adapted to store said data signals sequentially in response to shift-in signals, and to sequentially shift stored data signals to an output in response to shift-out signals; a source of clock signals; memory select circuit means responsive to said clock signals and to said timing signals for generating shift-in signals for storing the output signals of said first combining circuit means in said first and second memory circuit means in alternate time intervals; delay timer circuit means for generating delayed timing signals; shift signal generating means responsive to said clock signals and to said delayed timing signals for generating shift-out signals for shifting the data signals stored in said first or second memory circuit means to respective outputs of said first and second memory circuit means in the same time interval in which said data signals are entered into an associated one of said memory circuit means but delayed relative to the time at which said data signals are entered into the associated memory circuit means; second combining circuit means connected to the outputs of said first and second memory circuit means for receiving the data of said first and second memory circuit means in alternate time intervals and generating a train of output signals representing the combined outputs of said first and second memory circuit means, and recording means for recording the output signals of said second combining circuit means on a first track and for recording said delayed timing signals on a second track in timed relation with the recording of signals on said first track such that successive recorded delayed timing signals indicate successive time intervals during which the recorded events occurred.

2. The apparatus of claim 1 wherein said memory select circuit means includes a Divide by Two Circuit receiving said timing signals and having first and second states, said Divide by Two Circuit switching alternately between said first and second states in response to received timing signals; and gating circuit means responsive to the output states of said Divide by Two Circuit means for alternately coupling the output signals of said first combining circuit means to said first and second memory circuit means in successive alternate time intervals.

3. The apparatus of claim 2 wherein said first and second memory means each comprise a first-in, first-out memory having a data input receiving the data signals from said first combining circuit means, a shift-in terminal for receiving said shift-in signals, said memory select means including first gating circuit means for alternately gating said input data to said first and second memory circuit means in successive time intervals, and each memory circuit means having a data output terminal connected to the input of said second combining circuit means, and a shift-out terminal for receiving said shift-out signals for shifting the contents of said first and second memory circuit means in successive time intervals to said second combining circuit means.

4. The apparatus of claim 3 wherein said shift signal generating means includes a latch circuit responsive to the states of said Divide by Two Circuit and to said delayed timing signal for alternately generating first and second output signals corresponding to the output states of said Divide by Two Circuit delayed by said timing signal; and second gating means responsive to the output signals of said latch circuit and to said clock signals for generating said shift-out signals for application to said shift-out terminal of said first and second memory circuit means in successive time intervals corresponding to the same time intervals in which said first gating means enters data signals into said first and second memory circuit means respectively, but delayed relative to the time at which said data signals are entered into said first and second memory circuit means.

5. Apparatus for recording on a single channel signals from first and second sources, each source generating a signal representative of a measured event, and including a source of periodic timing signals for defining successive time intervals, said apparatus comprising: input circuit means for receiving the output signals of said first and second sources and displacing the signals of one of said sources in time relative to the signals from the other source, first combining circuit means responsive to said input circuit means for generating a train of signals representative of the combined signals from said sources; first and second memory circuit means, each receiving data signals from said first combining circuit means at an input for storing said input data signals in response to a shift-in signal, and adapted to shift stored data signals to an output in response to a shift-out signal; memory select circuit means receiving said timing signals for switching between first and second states responsive to successive timing signals to thereby generate enabling signals; a source of clock signals; first gating circuit means responsive to said clock signals and to the enabling signals provided by said memory select circuit means for clocking the output signal train from said first combining circuit means to the inputs of said first and second memory circuit means in alternate time intervals; delay circuit means for generating a delayed timing signal in timed relation with said timing signals; second gating circuit means responsive to said clock signals and to said delayed timing signal for shifting the data signals stored in said first or second memory circuit means to said outputs in the same time interval in which said data signals are clocked into said first or second memory circuit means but delayed relative to the time at which the data signals are clocked into said first or second memory circuit means; second combining circuit means receiving the output signals from said first and second memory circuit means in alternate time intervals and combining said output signals into a single train of signals; and recorder means for recording the output signals of said second combining circuit means on one track and for storing said delayed timing signal on a second track such that said delayed timing signal is stored in synchronism with the data signals corresponding to a time interval defined by one of said timing signals.

6. Apparatus for recording on a single channel signals from first and second sources, each source generating a signal representative of a measured event, and including a source of periodic timing signals for defining successive time intervals, said apparatus comprising: clock circuit means for generating clock signals; input circuit means for receiving the output data signals of said first and second sources and responsive to said clock signals for generating a first and second train of signals representative of the data signals from said sources with the signals from said first source being displaced in time relative to the signals from said second source; combining circuit means for receiving the signal trains from said input means and generating a train of input data signals representative of the combined signals for said sources, first and second memory circuit means, each receiving data signals at an input for storing said input data signals sequentially and for sequentially shifting stored data signals to an output; memory select circuit means responsive to said timing signals for storing the input data signals provided at the output of said combining circuit means in said first and second memory circuit means respectively in alternate time intervals; delay circuit means for generating delayed timing signals; and recording means for recording the input data signals of said first and second memory circuit means in alternate time intervals on a first track and for recording said delayed timing signals on a second track such that successive recorded timing signals indicate successive time intervals during which the events occurred as recorded on said first track.

7. In apparatus for recording combined signals from first and second sources, each source generating a signal representative of a measured event, and including a source of periodic timing signals for defining successive time intervals, the combination comprising: clock circuit means for generating clock signals; input circuit means for receiving the output signals of said first and second sources and responsive to said clock signals for generating first and second trains of signals having the signals in said first train displaced in time relative to the signals in said second train; combining circuit means receiving said first and second trains of signals and generating a train of data signals representative of the combined signals from said first and second sources: first and second signal storage means, each receiving data signals from said combining circuit means at an input for storing said data signals sequentially; memory select circuit means responsive to said timing signals for gating the data signals provided at the output of said combining circuit means to said first signal storage means in a first time interval and for gating the data signals provided at the output of said combining circuit means to said second signal storage means in the next successive time interval: and further signal storage means, and memory readout means for causing the data signals to be read out of said first and second signal storage means in the same time interval in which the data signals are gated to said first and second signal storage means, and to be stored by said further signal storage means, and means responsive to said timing signals for storing a time indication signal in association with the data signals stored for a given time interval for indicating at least the end of such time interval.

* * * * *